(12) United States Patent
Ovshinsky

(10) Patent No.: US 8,252,112 B2
(45) Date of Patent: Aug. 28, 2012

(54) HIGH SPEED THIN FILM DEPOSITION VIA PRE-SELECTED INTERMEDIATE

(75) Inventor: Stanford R. Ovshinsky, Rochester Hills, MI (US)

(73) Assignee: Ovshinsky Innovation, LLC, Bloomfield Hills, MI (US)

(*) Notice: Subject to any disclaimer, the term of this patent is extended or adjusted under 35 U.S.C. 154(b) by 954 days.

(21) Appl. No.: 12/209,699

(22) Filed: Sep. 12, 2008

(65) Prior Publication Data

US 2010/0068870 A1    Mar. 18, 2010

(51) Int. Cl.
*C30B 25/00* (2006.01)

(52) U.S. Cl. .............. 117/108; 117/84; 117/88; 117/89; 117/91; 117/92; 117/93; 117/98; 117/99; 117/103

(58) Field of Classification Search .............. 117/84, 117/88, 89, 91, 92, 93, 98, 99, 103, 108
See application file for complete search history.

(56) References Cited

U.S. PATENT DOCUMENTS

| | | | | |
|---|---|---|---|---|
| 4,504,518 A * | 3/1985 | Ovshinsky et al. | ........... | 427/575 |
| 6,313,017 B1 * | 11/2001 | Varhue | ........... | 438/503 |
| 7,072,028 B2 * | 7/2006 | Powell et al. | ........... | 356/72 |
| 2003/0068869 A1 * | 4/2003 | Todd | ........... | 438/398 |
| 2006/0219170 A1 * | 10/2006 | Ovshinsky | ........... | 118/715 |

* cited by examiner

*Primary Examiner* — Matthew Song
(74) *Attorney, Agent, or Firm* — Kevin L. Bray

(57) ABSTRACT

A method and apparatus for the unusually high rate deposition of thin film materials on a stationary or continuous substrate. The method includes delivery of a pre-selected precursor intermediate to a deposition chamber and formation of a thin film material from the intermediate. The intermediate is formed outside of the deposition chamber and includes a metastable species such as a free radical. The intermediate is pre-selected to include a metastable species conducive to the formation of a thin film material having a low defect concentration. By forming a low defect concentration material, deposition rate is decoupled from material quality and heretofore unprecedented deposition rates are achieved. In one embodiment, the pre-selected precursor intermediate is $SiH_3$. The method further includes combining the pre-selected precursor intermediate with a carrier gas, preferably in a deactivated state, where the carrier gas directs the transport of the pre-selected precursor intermediate to a substrate for deposition of the thin film material.

56 Claims, 4 Drawing Sheets

HIGH SPEED THIN FILM DEPOSITION VIA PRE-SELECTED INTERMEDIATE

FIELD OF INVENTION

The instant invention relates generally to an apparatus and method for the high rate deposition of high quality amorphous, nanocrystalline, microcrystalline or polycrystalline materials. More specifically, the instant invention provides an apparatus and method for energizing a deposition precursor to form a set of precursor intermediates from which a subset is selected and directed to a deposition process to form a material having a low concentration of structural and electronic defects. Most specifically, the instant invention provides an apparatus and method for isolating and delivering a pre-selected deposition intermediate to a plasma deposition process. The pre-selected deposition intermediate is designed to optimize the quality of the material in its as-deposited state. Species derived from the deposition precursor that are deleterious to the growth rate or quality of the as-deposited material are excluded. As a result, independence of deposition rate and material quality is achieved and deposition at heretofore unavailable rates is enabled. The benefits of the instant invention extend to the deposition of thin film materials generally, including semiconductor materials and photovoltaic materials. When applied to the field of solar energy, the instant invention enables the production of energy from photovoltaic materials at costs that meet or beat the cost of fossil fuels.

BACKGROUND OF THE INVENTION

The recent escalation of the cost of energy derived from fossil fuels has stimulated strong interest in the development of alternative energy sources. Significant investments in areas such as batteries, fuel cells, hydrogen production and storage, biomass, wind power, algae, and solar energy seek to develop new ways of creating and storing energy in an economically competitive fashion. The ultimate objective is to minimize society's reliance on increasingly scarce fossil fuels and to do so in a particularly environmentally friendly way that minimizes or eliminates greenhouse gas production at a cost that beats or directly competes with fossil fuels.

A number of experts have concluded that to avoid the serious consequences of global warming, it is necessary to maintain $CO_2$ at levels of 550 ppm or less. To meet this target, based on current projections of world energy usage, the world will need 17 TW of carbon-free energy by the year 2050 and 33 TW by the year 2100. The estimated contribution of various carbon-free sources toward the year 2050 goal are summarized below:

| Source | Projected Energy Supply (TW) |
|---|---|
| Wind | 2-4 |
| Tidal | 2 |
| Hydro | 1.6 |
| Biofuels | 5-7 |
| Geothermal | 2-4 |
| Solar | 600 |

Based on the expected supply of energy from the different carbon-free sources, it is apparent that solar energy is the only viable solution to solving the global climate change problem and ridding the world of greenhouse gases. With the instant invention, the time horizon required to reap substantial benefits from solar energy will be significantly shortened.

The field of solar energy is currently dominated by solar cells constructed of crystalline silicon. Crystalline silicon, however, has a number of disadvantages as a solar energy material. First, preparation of crystalline silicon is normally accomplished through a seed-assisted Czochralski method. The method entails a high temperature melting process along with controlled cooling at near-equilibrium conditions and refining to produce a boule of crystalline silicon. Although high purity crystalline silicon can be achieved and the Czochralski method is amenable to n- and p-type doping, the method is inherently slow and energy intensive.

Second, as an indirect gap material, crystalline silicon has a low absorption efficiency. Thick layers of crystalline silicon are needed to obtain enough absorption of incident sunlight to achieve reasonable solar conversion efficiencies. The thick layers add to the cost of crystalline silicon solar panels and lead to a significant increase in weight. The increased weight necessitates bulky installation mounts and precludes the use of crystalline silicon in a number of applications.

A number of alternatives to crystalline silicon are currently being pursued in an effort to achieve more versatile, more efficient and less expensive photovoltaic materials. Among the alternatives are CdTe, CdS, and CIGS (Cu—In—Ga—Se alloys). CdTe and CdS suffer from the problem that Cd is a toxic element that requires special disposal procedures. In addition, Te is a relatively scarce element, having an abundance just below that of Pt. Although CIGS shows promising solar efficiency, it is difficult to achieve uniform stoichiometry over the large scale substrates required for high-volume manufacturing.

Amorphous silicon (and hydrogenated or fluorinated forms thereof) is an attractive alternative to crystalline silicon. Amorphous silicon is a direct gap material with a high absorption efficiency. As a result, lightweight and efficient solar cells based on thin layers of amorphous silicon or related materials are possible. The instant inventor, Stanford R. Ovshinsky, is the seminal figure in modem thin film semiconductor technology. Early on, he recognized the advantages of amorphous silicon (as well as amorphous germanium, amorphous alloys of silicon and germanium as well as doped, hydrogenated and fluorinated versions thereof) as a solar cell material and was the first to recognize the advantages of nanocrystalline silicon as a photovoltaic material. Stanford R. Ovshinsky also pioneered the continuous manufacturing techniques needed to produce thin film, flexible solar panels based on amorphous, nanocrystalline, microcrystalline, polycrystalline or composite semiconductors Representative discoveries of Stanford R. Ovshinsky in the field of amorphous semiconductors and photovoltaic materials are presented in U.S. Pat. No. 4,400,409 (describing a continuous manufacturing process for making thin film photovoltaic films and devices); U.S. Pat. No. 4,410,588 (describing an apparatus for the continuous manufacturing of thin film photovoltaic solar cells); U.S. Pat. No. 4,438,723 (describing an apparatus having multiple deposition chambers for the continuous manufacturing of multilayer photovoltaic devices); U.S. Pat. No. 4,217,374 (describing suitability of amorphous silicon and related materials as the active material in several semiconducting devices); U.S. Pat. No. 4,226,898 (demonstration of solar cells having multiple layers, including n- and p-doped); U.S. Pat. No. 5,103,284 (deposition of nanocrystalline silicon and demonstration of advantages thereof); and U.S. Pat. No. 5,324,553 (microwave deposition of thin film photovoltaic materials) as well as in articles entitled "The material basis of efficiency and stability in amorphous photovoltaics" (Solar Energy Materials and Solar Cells, vol. 32, p. 443-449 (1994); and "Amorphous and disordered materials—The basis of new industries" (Materials Research Society Symposium Proceedings, vol. 554, p. 399-412 (1999).

Current efforts in photovoltaic material manufacturing are directed at increasing the deposition rate. Higher deposition rates lower the cost of thin film solar cells and lead to a decrease in the unit cost of electricity obtained from solar energy. As the deposition rate increases, thin film photovoltaic materials become increasingly competitive with fossil fuels as a source of energy. Presently, PECVD (plasma-enhanced chemical vapor deposition) is the most cost-effective method for the commercial-scale manufacturing of amorphous silicon and related solar energy materials. Current PECVD processes provide uniform coverage of large-area substrates with device quality photovoltaic material at a deposition rate of ~1-20 Å/s.

In order to leap beyond the present deposition rates, it is necessary to overcome basic limitations associated with current PECVD techniques. One problem with PECVD-deposited photovoltaic materials is the presence of a high concentration of intrinsic defects in the as-deposited state. The intrinsic defects include structural defects (e.g. dangling bonds, strained bonds, unpassivated surface states, non-tetrahedral bonding distortions, coordinatively unsaturated silicon or germanium) that create electronic states within the bandgap of the photovoltaic material. The midgap states detract from solar conversion efficiency because they act as nonradiative recombination centers that deplete the concentration of free carriers generated by absorbed sunlight. Instead of being available for external current, the energy of many of the photoexcited free carriers is dissipated thermally. The external current delivered by a photovoltaic material is reduced accordingly.

The intrinsic defects are also believed to contribute to a degradation of solar cell performance of silicon-based photovoltaic materials through the Staebler-Wronski effect. The Staebler-Wronski effect is a photo-induced degradation of amorphous silicon and related materials (e.g. hydrogenated, fluorinated or doped forms thereof) that can cause a decrease in solar efficiency of up to 25%. Although the origin of the Staebler-Wronski effect has not been definitively established, it is believed that the creation of additional midgap defect states due to a transfer of energy from photoexcited carriers to intrinsic structural defects is a contributing factor.

One strategy for reducing the concentration of intrinsic defects in amorphous semiconductors and other photovoltaic materials prepared by conventional PECVD is to include a defect compensating agent in the plasma. Inclusion of fluorine or high excess hydrogen in the plasma, for example, leads to a marked improvement in the quality of the material and the ability to make nanocrystalline phases. The compensating agents passivate defects, saturate bonds, relieve bond strain and remove non-tetrahedral structural distortions that occur in as-deposited material. As a result, the concentration of midgap band states is reduced and higher solar conversion efficiency is achieved.

Recognizing that the use of excess $H_2$ leads to poor gas utilization and the formation of polysilane powders, Ovshinsky has advocated the use of fluorine. In particular, Ovshinsky has shown that the inclusion of fluorine provides more regular bonding, leads to fewer defects, and enables deposition of nanocrystalline materials. (See U.S. Pat. No. 5,103,284 (formation of nanocrystalline silicon from $SiH_4$ and $SiF_4$); U.S. Pat. No. 4,605,941 (showing substantial reduction in defect states in amorphous silicon prepared in presence of fluorine); and U.S. Pat. No. 4,839,312 (presents several fluorine-based precursors for the deposition of amorphous and nanocrystalline silicon)).

Although defect compensating agents improve the performance of photovoltaic materials, it has been necessary to slow the deposition process to realize their benefits. Compensation or repair of intrinsic defects requires a sufficient time of contact of the compensating agent with as-deposited photovoltaic material. It is also necessary for the compensating agents to act throughout the deposition process. When an initial layer of photovoltaic material is deposited, it includes a certain concentration and distribution of intrinsic defects. Since the defect compensation process occurs preferentially at the surface, it is necessary to expose the as-deposited material to the compensating agent before an additional thickness of photovoltaic material is deposited. If the deposition continues before the defects are compensated, the defects become incorporated within the bulk of the material and are increasingly difficult to remove by subsequent exposure to a defect compensating agent. As a result, the best quality photovoltaic material is prepared at deposition rates slow enough to insure that the defect compensating agents fully interact with the as-deposited material.

S. R. Ovshinsky has further shown that the Staebler-Wronski effect is greatly diminished in nanocrystalline silicon. Through formation of nanocrystalline silicon or a nanocrystalline phase within an amorphous silicon matrix, photodegradation and light soaking effects are greatly ameliorated. Nanocrystalline silicon provides sufficient order to minimize intrinsic defects while providing enough structural flexibility to avoid formation of a rigid crystalline silicon matrix. As a result, nanocrystalline silicon provides both a high absorption efficiency and a stable photovoltaic response.

In addition to forming materials having a low concentration of defects, it is desirable to deposit materials that exhibit favorable electronic properties. In photovoltaic materials, for example, a high collection efficiency of photoexcited carriers is desired. When incident sunlight penetrates and is absorbed by a photovoltaic material, it creates photoexcited carriers in the interior thereof by promoting electrons from the valence band to the conduction band. In order to harness electrical energy from the photovoltaic material, it is necessary for the photoexcited carriers to move through the material to an electrical contact placed at the surface of the material. The ability of photoexcited carriers to reach surface contacts depends on the concentration of defects within the material and on the transport properties of the carriers. Carrier mobility is a measure of the ease with which carriers can migrate spatially within a material and carrier collection is facilitated if the mobility of electrons and holes is high. An insufficient carrier mobility increases the likelihood that a photoexcited carrier is trapped, recombined or otherwise dissipated before it is extracted from the material to contribute to an external current.

A drawback of amorphous silicon as a solar energy material is its low hole mobility. The low hole mobility reduces the solar efficiency of amorphous silicon and makes simple p-n junction devices based on amorphous silicon impractical. Instead, more complicated p-i-n structures are needed to sweep carriers to compensate for the poor hole mobility. An alternative strategy for overcoming the poor hole mobility of amorphous silicon was invented by S. R. Ovshinsky in U.S. Pat. No. 5,103,284. This patent describes the formation of a clustered semiconductor material, with dimensions on the order of 10-50 Å, that has a state of order intermediate between the extended periodic lattice structure of crystalline silicon and the random, disordered structure of amorphous silicon. Ovshinsky showed that the ordered cluster material represents a new state of matter having properties that combine features of the amorphous and crystalline phases. In particular, Ovshinsky showed that the ordered cluster material possesses the high carrier mobility of crystalline silicon and the high absorption efficiency of amorphous silicon. Ovshinsky has further developed diagnostic methods for detecting ordered clusters and has elucidated the concept of intermediate range order as a signature for high quality photovoltaic materials. Although the ordered cluster material has desirable properties, current techniques for forming it suffer from low deposition rates.

A need exists in the art for a method for preparing photovoltaic materials (including amorphous, nanocrystalline, microcrystalline, and polycrystalline forms of silicon, germanium, and alloys of either) at high deposition rates without sacrificing the photoexcitation efficiency, carrier collection efficiency, and other attributes of quality. The low deposition rates needed to achieve high efficiency photovoltaic materials through conventional PECVD limits the economic competiveness of photovoltaic materials and motivates a search for new deposition processes.

SUMMARY OF THE INVENTION

This invention provides a method and apparatus for the high rate deposition of amorphous, nanocrystalline, microcrystalline, and polycrystalline materials, including photovoltaic materials based on semiconductors and semiconductor alloys. Exemplary materials that can be prepared with the instant invention include the amorphous, nanocrystalline, microcrystalline, polycrystalline and single-crystalline forms of materials such as silicon, alloys of silicon, germanium, alloys of germanium, hydrogenated and fluorinated materials that include silicon or germanium, and combinations thereof.

The invention provides a selective plasma deposition process and apparatus that focuses on controlling the number and type of precursor intermediates allowed to participate in the formation of a thin film material. The precursor intermediates are selected to correspond to those species derived from a precursor gas that are most conducive to the formation of a high quality material. The selected precursor intermediates are combined with an inert carrier gas in a deposition process to form a material that has a low concentration of defects. By pre-selecting favorable precursor intermediates and delivering only those precursor intermediates to a deposition chamber, the defect concentration of the as-deposited material is significantly reduced. The need for compensating agents or other reparative processing steps is thereby minimized or eliminated and high quality photovoltaic materials can be produced at deposition rates of up to ~400 Å/s and perhaps even higher.

In a conventional plasma deposition process, the precursor is introduced as a gas and energized to form a random and chaotic distribution of intermediate species. The intermediate species include ions, ion-radicals and neutral radicals derived from the elements and fragments of the precursor molecules. The instant method recognizes that within the distribution of intermediate species, certain species are conducive to the formation of thin film materials with low defect density and favorable carrier transport, while other species are detrimental because they promote the formation of structural or electronic defects and impair the performance characteristics of the as-deposited thin film material.

One embodiment of the invention includes a pre-selection of the preferred deposition intermediates from a precursor, delivery of only the preferred precursor intermediates to a plasma reactor, combining the preferred precursor intermediates with a plasma or energized (deactivated) gas mixture formed from an inert carrier gas, transport of the preferred precursor intermediates to a substrate, and deposition of a thin film material, such as an amorphous semiconductor, electronic material, photovoltaic material or computer processing or memory material, from the preferred precursor intermediates. The defect concentration in the as-deposited material is reduced by not delivering those intermediate species derived from a precursor that detract from the quality of the as-deposited material to the deposition process. The deleterious species are prevented from entering the reactor and interacting with the carrier gas. The preferred precursor intermediates may be formed by energizing a precursor to form a set of intermediates and isolating the preferred intermediates for delivery to the deposition process. Isolation of the pre-selected preferred intermediate occurs external to the deposition process and following isolation, the pre-selected preferred intermediate is introduced to a deposition chamber and transported without significant alteration by a carrier gas to a substrate for deposition of a thin film material. Alternatively, the preferred precursor intermediates may be selectively formed directly from the precursor while minimizing the formation of detrimental intermediates.

Another embodiment of the invention includes a pre-selection of the preferred deposition intermediates from a precursor, delivery of the preferred precursor intermediates to a plasma reactor, combining the preferred precursor intermediates with an inert carrier gas, forming a plasma from the mixture of the preferred precursor intermediates and inert carrier gas, transport of the energized preferred precursor intermediates to a substrate, and deposition of a thin film material, such as an amorphous semiconductor or other photovoltaic material, from the energized preferred precursor intermediates. The defect concentration in the as-deposited material is reduced by not delivering those intermediate species derived from a precursor that detract from the quality of the as-deposited material to the deposition process. The preferred precursor intermediate is pre-selected, isolated and delivered in the absence of deleterious species to the deposition chamber.

Plasma activation of the preferred precursor intermediates in this embodiment produces a narrower distribution of energized precursor species and biases the distribution toward the most favorable species for deposition of the thin film material. The preferred precursor intermediates may be formed by energizing a precursor to form a set of intermediates and isolating the preferred intermediates for delivery to the deposition process. In one embodiment, once introduced to the deposition chamber, the pre-selected preferred precursor intermediate self-organizes into a desirable higher order intermediate or deposition species. Alternatively, the preferred precursor intermediates may be selectively formed from the precursor while minimizing the formation of detrimental intermediates.

In a further embodiment, the pre-selected preferred precursor intermediate is commingled with an unactivated flowing carrier gas and transported to a substrate for deposition of a thin film material.

Other embodiments of the instant invention include the co-introduction of fluorine with the pre-selected deposition intermediate. Fluorine assists with the formation of phases having order or periodicity intermediate between the amorphous and single crystalline states. In one embodiment, nanocrystalline and microcrystalline phases of silicon or germanium (or alloys thereof) are formed by introducing a fluorine precursor with a pre-selected precursor intermediate.

Alternatively, a preferred additive species derived from a fluorine precursor may be combined with a pre-selected precursor intermediate in a plasma deposition process to form a partially ordered material (such as an intermediate range order material).

The invention further includes sensing the presence of the pre-selected precursor intermediate during the deposition process, monitoring the inert carrier gas plasma, detecting the species present in the ambient adjacent to the substrate, and monitoring one or more properties of the as-deposited material. The deposition process can be programmed through a feedback control protocol that is responsive to deviations of deposition conditions from the optimal condition. In one embodiment, the distribution of plasma or precursor intermediate species is sensed with a mass spectrometer. Sensing may occur in the vicinity of plasma generation, in the region adjacent to introduction of the pre-selected precursor intermediate, and/or in the growth front adjacent to the deposition surface. Sensing may also occur at the surface of or within the interior of the as-deposited material. In one embodiment, an optical probe of the presence of defects in the as-deposited material is employed. Raman spectroscopy, for example, can be utilized in real time to detect the presence of dihydride defects in silicon or germanium based materials. Ellipsometry may also be employed to monitor optical constants of the as-deposited material. In a further embodiment, luminescence spectroscopy is used to detect the presence of midgap defects.

In one embodiment, the apparatus includes a plasma activation source for activating an inert carrier gas or a combination of an inert carrier gas and a pre-selected preferred deposition intermediate derived from a deposition precursor. Isolation and pre-selection of the preferred deposition intermediate occurs external to the apparatus. The pre-selected preferred deposition intermediate may be introduced to the inert carrier gas before or after plasma activation occurs. If after plasma activation, the pre-selected preferred precursor intermediate may be combined with the carrier gas in an activated or deactivated state. In each instance, the pre-selected preferred deposition intermediate is transported to a substrate and a thin film material is deposited therefrom.

The apparatus may further include a sensing unit to detect the state of the inert carrier gas plasma or pre-selected precursor intermediate in its unactivated, energized, or activated state. The sensing unit assesses the distribution of species at one or more points in the apparatus and delivers a process signal that reflects the distribution to a feedback controller. The feedback controller compares the process signal to a target signal that has been predetermined to correlate with the optimum conditions for thin film deposition. The feedback controller responds to deviations from the target signal by adjusting the flow rate or composition of the inert carrier gas, the flow rate or composition of one or more pre-selected preferred precursor intermediates, the ratio of the amount of inert carrier gas relative to the amount of pre-selected preferred precursor intermediates, the pressure of the deposition apparatus, and/or the substrate temperature. The sensing unit may also include an optical or electrical probe to assess the quality of the as-deposited material.

By permitting the formation of as-deposited material with a low concentration of defects, the instant apparatus avoids the need to dedicate process time to the removal or passivation of intrinsic defects. Deposition rate and quality of the deposited material become decoupled. As a result, the deposition rate can be increased substantially without compromising material quality and the unit cost of solar energy is reduced to a level that becomes less than or equal to the cost of fossil fuels. Implementation of the instant invention allows mankind to reduce its dependence on fossil fuels and democratizes energy by enabling all countries, regardless of natural resources, to become self sufficient in energy. The invention provides a fundamental contribution to plasma chemistry and physics and exploits the advance to achieve a process system that can produce not just megawatts of photovoltaic material, but rather gigawatts in a machine that is much smaller than the length of a football field and that is capable of producing miles and miles of photovoltaic material in a single year.

The instant invention allows for a tremendous increase in the throughput and film formation rate in continuous web deposition processes. With the invention, the web speed can be increased without sacrificing the quality of the thin film layers produced and without introducing defects that diminish photovoltaic efficiency. The instant invention enables for the first time a GW manufacturing capacity in a compact facility. The technology can be applied to single layer devices as well as multilayer devices, including the triple junction solar cell, that provide bandgap tuning and more efficient collection of the solar spectrum.

The impact of the invention extends beyond solar energy to the entire energy cycle. By achieving a cost-superior method of producing electrical energy, the instant invention unlocks the hydrogen economy by making it possible to obtain hydrogen from water, including brackish water, at costs that obviate the need for fossil fuels. Hydrogen is the holy grail of energy supplies because it is the most abundant element in the universe and provides an inexhaustible fuel source to meet the increasing energy demands of the world. The sources of hydrogen are also geographically well-distributed around the world and are accessible to most of the world's population without the need to import. Since the photovoltaic materials produced by the instant invention are thin film, flexible, light weight and can be produced by the mile, the harvesting of hydrogen from lakes, ponds, and other sources of water becomes a simple matter of spreading the photovoltaic material prepared by the instant apparatus across the surface of water and collecting the hydrogen as it is produced from the sunlight. It is important to note that the photovoltaic material itself can be spread across land, with electrodes extending to a source of water to effect hydrogen production. Multi-junction solar cells are especially well-adapted for water splitting applications. Because of the extremely low cost of splitting water with solar materials prepared from the instant invention, it also becomes economically viable to purify brackish or contaminated water by splitting it and recombining the hydrogen and oxygen produced to form pure water.

Displacement of fossil fuels as the primary energy source of the world has enormous consequences for the quality of life on Earth. Fossil fuels are highly polluting, contribute to global warming, and endanger the stability of the earth's ecosystem. The use of solar energy and hydrogen as fuel sources will eliminate much of the world's pollution. Hydrogen is the ultimate clean fuel source because combustion of hydrogen produces only water as a byproduct. The production of greenhouse gases that are so harmful to the Earth's environment is avoided. The sun fuses hydrogen for its energy and this fusion provides the photons utilized in our photovoltaic material. Up until now, a low cost method of creating electrical energy from the solar spectrum has been lacking. This invention fulfills this important need and enables the completion of an energy cycle that begins with the sun.

Other problems associated with the use of fossil fuels are also avoided with the instant invention. As worldwide use of fossil fuels has increased, the world has appreciated that fossil fuels are a truly finite resource and concern has grown that fossil fuels will become depleted and very expensive in the foreseeable future. Scarcity raises the possibility that escalating costs could destabilize economies as well as increase the likelihood that nations will go to war over the remaining reserves.

The problems of pollution, scarcity, and conflict associated with fossil fuels are eliminated by the instant invention. The revolutionary breakthrough presented in this invention is a total energy solution that includes a machine, creative manipulation of a plasma, and high deposition rates. The machine may also include the pore cathode, disclosed in pending U.S. patent application Ser. Nos. 11/447,363 and 10/043,010, the disclosures of which are incorporated by reference herein. The pore cathode assures uniformity in the thickness and activity of the deposited photovoltaic material over any width of web by utilizing pores of a size and spacing that are particularly suited to the optimal formation of a plasma.

Gigawatt production rates become achievable for the first time with the instant invention in a single year in a compact manufacturing plant. As a result, the capital costs per watt of electricity plummet and the product cost becomes low enough to effectively compete with fossil fuels. The overall result of the instant invention will greatly expand industries that provide high-valued jobs to the economy and promote the educational system by defining new frontiers in physics, chemistry and technology. The instant inventor projects that the invention will have consequences that are as far-reaching worldwide as the advent of electricity was in prior centuries. It is the sincere hope of the instant inventor that this breakthrough will not only make energy available in a secure manner in local areas, but also free mankind from the paradigm that energy can only be found in areas of the world susceptible to wars. The need to solve climate change is paramount for human civilization to advance to a higher level.

DETAILED DESCRIPTION OF THE ILLUSTRATED EMBODIMENTS

Although this invention will be described in terms of certain preferred embodiments, other embodiments that are apparent to those of ordinary skill in the art, including embodiments that do not provide all of the benefits and features set forth herein and including embodiments that provide positive benefits for high-volume manufacturing, are also within the scope of this invention. Accordingly, the scope of the invention is defined only by reference to the appended claims.

Figure 1:
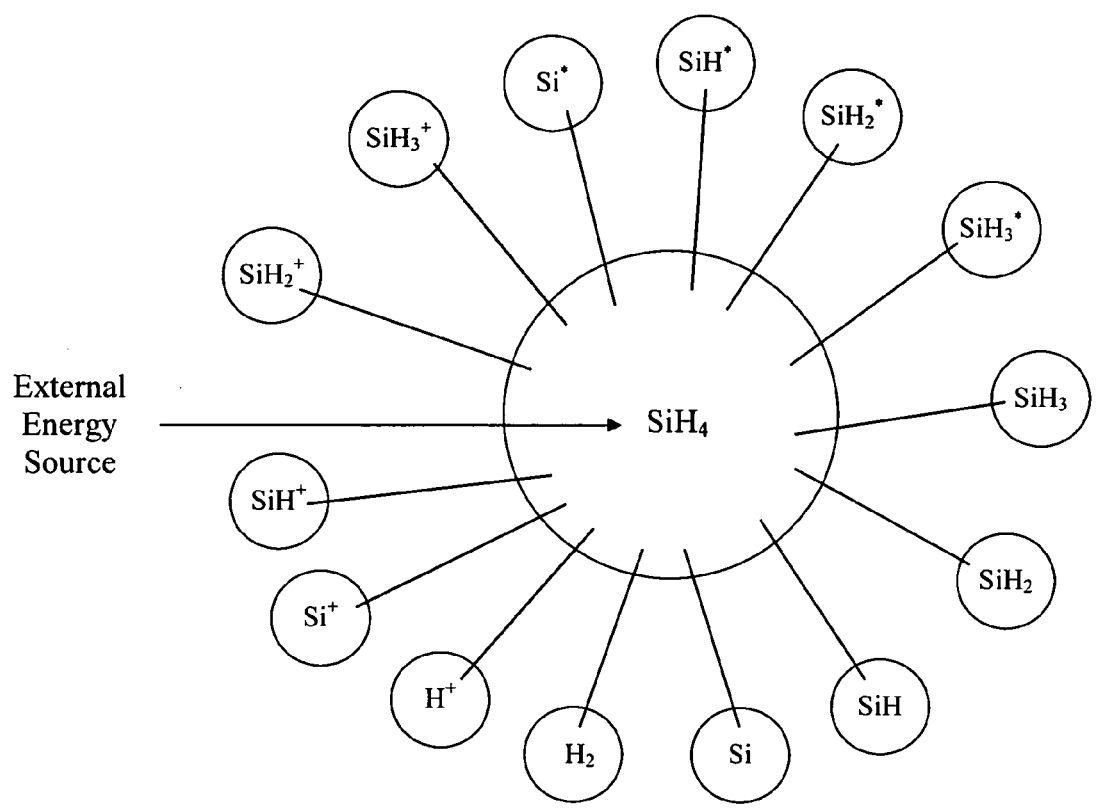
FIG. 1 is a schematic depiction of several species present in a conventional silane plasma.

This invention provides a high deposition rate apparatus for the formation of thin film materials, including semiconducting, memory, and photovoltaic materials, that have a low concentration of intrinsic defects in the as-deposited state. The invention recognizes that a deposition precursor activated in a conventional plasma includes intermediate species that are both conducive to and detrimental to the formation of high quality photovoltaic materials. FIG. 1 depicts the distribution of potential precursor intermediates present when the precursor gas silane ($SiH_4$) is activated to form a plasma. Silane is commonly used in the formation of amorphous silicon, modified forms of amorphous silicon, nanocrystalline silicon, microcrystalline silicon, and polycrystalline silicon. The precursor intermediates present in a plasma activated from silane includes a variety of ions, radicals and molecular species. The radicals may be neutral or charged. Neutral radicals include $SiH_3$, $SiH_2$, SiH, Si, and H. The species may be in a ground state or an excited state (designated by an asterisk (e.g. SiH* is a radical in an excited state)). In a conventional plasma process, the relative proportions of the different precursor intermediates derived from silane depend on deposition parameters such as the electron temperature, electron density, and residence time. Depending on conditions, some or all of the species depicted in FIG. 1 may be present in the deposition process. In general, however, when a deposition precursor is activated to form a conventional plasma, the plasma includes precursor intermediates that are conducive to the formation of high quality as-deposited material as well as intermediates that are detrimental to the formation of high quality as-deposited material. The neutral radical $SiH_3$, for example, is generally believed to be beneficial in forming high quality materials based on amorphous silicon, while the neutral radical $SiH_2$ is thought to be detrimental.

One of many objectives of the instant invention is to insure the delivery of the most optimum precursor intermediate to the growth zone of a thin film deposition apparatus. The instant invention recognizes that certain intermediates available from a precursor are preferred for the deposition of a thin film material and provides as a deposition strategy an apparatus and method for delivering one or a few preferred pre-selected precursor intermediates to the deposition process. The objective is to pre-select and isolate ex situ the particular intermediates available from a precursor that are most conducive to the formation of a high quality thin film material and deliver only those intermediates to the deposition process. Isolation and delivery of the preferred precursor intermediate in the absence of deleterious precursor intermediates avoids interactions of deleterious intermediates with the as-deposited material as well as with beneficial precursor intermediates that may serve to convert the beneficial precursor intermediates to less effective species. As a result, the population of the beneficial precursor intermediates is maximized and the deposition medium delivered from outside the deposition chamber to the surface of the growing thin film material is comprised primarily of beneficial precursor intermediates free of interference from the detrimental species that are generated in a conventional plasma process.

In one embodiment, one or a few preferred intermediates are formed from a deposition precursor, isolated, and delivered to a deposition apparatus in the absence of other precursor intermediates. The preferred intermediate may be formed just prior to deposition or prepared in advance and stored for delivery to the deposition apparatus. It is generally preferred to isolate a single, most optimum precursor intermediate and deliver it to the deposition apparatus. In one embodiment, the pre-selected precursor intermediates are provided to the plasma activation region of a deposition apparatus along with a carrier gas and a plasma is formed. In a preferred embodiment, the carrier gas is unreactive toward the pre-selected preferred precursor intermediate. The plasma so formed includes the pre-selected precursor intermediate and the carrier gas in an activated state. As used herein, an activated state is a plasma state of matter that may include ions, ion-radicals, neutral radicals, and/or neutral atomic or molecular species as components. The plasma components may include atoms in a ground or excited electronic state. A precursor intermediate in an activated state may be referred to herein as an activated precursor intermediate. The plasma of this embodiment may also include species of the carrier gas in an activated state.

Once formed, the plasma is directed to a substrate for deposition of a thin film material. The region immediately adjacent the surface of the growing film may be referred to herein as the growth zone. In one embodiment, the substrate is remote from the plasma activation region and the state of matter of the species in the growth zone is not a plasma, but rather an energized deposition medium. As used herein, the deposition medium refers to the collection of species from which the constituents of the deposited thin film material are drawn. The deposition medium is adjacent to the surface of the growing thin film and is present within the growth zone. In addition to species that contribute atoms to the deposited film, the deposition medium may also include species, such as species derived from the carrier gas, that are not incorporated into the deposited thin film.

An energized deposition medium is an excited gas phase state of matter that may include ions, ion-radicals, neutral radicals, and/or neutral atomic or molecular species as components in a non-activated state. The energized deposition medium includes species that may be in an excited rotational, vibrational or electronic state. In principle, the same components that may be present in a plasma may also be present in an energized deposition medium, but the conditions (temperature, pressure, potential difference etc.) are such that a plasma cannot be sustained. In the case of a substrate remote from the plasma activation region, for example, expansion of the plasma as it progresses toward the substrate leads to a drop in pressure that destabilizes the plasma to form an energized gas phase medium from which a thin film is deposited. The energized deposition medium of this embodiment may include energized species derived from the carrier gas as well as energized precursor intermediates. The energized deposition medium may include a portion of species that are unexcited in addition to species that are in an energetically excited state. In one embodiment, the energized deposition medium consists essentially of neutral species (radicals and/or molecules).

In another embodiment, the pre-selected precursor intermediates are provided to the deposition apparatus between the plasma activation region and the substrate. In this embodiment, a plasma is formed from the inert carrier gas in the plasma activation region of the deposition apparatus and the plasma is directed toward the substrate. At some point after the plasma destabilizes to form an energized state of the carrier gas, one or more pre-selected precursor intermediates are delivered to the deposition apparatus and incorporated into the energized carrier gas to form an energized deposition medium from which a thin film is deposited on the substrate. When combined with the energized carrier gas, the pre-selected preferred precursor intermediate may interact with energized carrier gas species to become energized. The likelihood of energizing the pre-selected preferred precursor intermediate depends in part on the degree to which the carrier gas is energized. The more highly energized the carrier gas, the more likely it is that the pre-selected preferred precursor intermediate becomes energized. As a general rule, the carrier gas is most energized in the activated state of a plasma and becomes less energized with increasing distance from the plasma activation region. Carrier gas species can become less energized due to motion, collisions, deactivation, deexcitation, photon or ion emission, or other processes that liberate or transfer energy. In a typical scenario, some fraction of the pre-selected preferred precursor intermediate is energized and some fraction is not. Embodiments of the instant invention, however, include energized deposition media in which all or most of the pre-selected preferred precursor intermediate is energized, energized deposition media in which little or none of the pre-selected preferred precursor intermediate is energized, and a continuous spectrum in between in which various proportions of the pre-selected precursor intermediate are energized and various proportions of the pre-selected precursor intermediate remain unenergized.

It is noted that use of a carrier gas represents one embodiment of the instant invention. Embodiments without a carrier gas in which a pre-selected preferred precursor intermediate is delivered to a substrate for thin film deposition are also within the scope of the instant invention. If used, the energetic state of the carrier gas can range from activated to deactivated. The carrier gas may be ionized or non-ionized. The carrier gas may be excited or unexcited. In one embodiment, the carrier gas consists essentially of neutral molecules where the neutral molecules are produced upon relaxation or deactivation of a carrier gas plasma or the neutral carrier gas molecules are delivered as such to the deposition apparatus and never activated or ionized during transport to the substrate.

It is important to note that energizing the pre-selected preferred precursor intermediate need not entail an alteration of the state of charge of the intermediate. A neutral radical derived from the deposition precursor, for example, may remain a neutral radical when energized. By way of example, a neutral radical can be energized from a ground electronic state to an excited electronic state by the energized species of the carrier gas without undergoing an ionization event. As a result, the energized deposition medium may include the pre-selected preferred precursor intermediate in a state that is energized or unenergized, in a state that is ionized or not ionized, and/or in a state that is the same or different from the state in which it is delivered to the deposition apparatus. In a preferred embodiment, the pre-selected preferred intermediate is introduced to the deposition apparatus from outside of the deposition apparatus in a state pre-optimized for thin film deposition on the substrate and remains in that state, or a state that readily transforms to that state, upon interaction with the carrier gas and transport to the substrate.

In one embodiment, an initial plasma is formed from a combination of the carrier gas and only the pre-selected preferred intermediate. By restricting the precursor source to only the preferred pre-selected precursor intermediates, a plasma more conducive to the formation of a high quality material is generated in the plasma activation region. The carrier gas is selected to avoid reactions with the preferred pre-selected precursor intermediate, so the plasma formed is enriched in activated forms of the preferred precursor intermediate. The thin film material deposited from this plasma is accordingly of higher quality. By way of example, a plasma formed from silane as the precursor source (alone or in the presence of a carrier gas) will differ in the distribution of species from a plasma formed from neutral $SiH_3$ as a precursor source (alone or in the presence of a carrier gas). In one embodiment, the concentration of $SiH_2$ radicals is lower in a plasma formed from neutral $SiH_3$ radicals as the precursor source than from $SiH_4$ as the precursor source. The initial plasma may serve as the deposition medium from which a thin film material is deposited or may be transported, expanded (depressurized) or otherwise deactivated to form a non-plasma energized deposition medium that is used to form the thin film material.

In another embodiment, an initial plasma is formed from the carrier gas in the activation region of the apparatus and one or more preferred pre-selected precursor intermediates is delivered to the activation region of the deposition apparatus. The pre-selected precursor intermediate is activated in the presence of a pre-existing plasma of the carrier gas to form a secondary plasma. The secondary plasma may serve as an energized deposition medium for formation of a thin film material. Alternatively, the secondary plasma may be transported, expanded (depressurized), or otherwise deactivated to form an energized deposition medium for the formation of a thin film material. By restricting the precursor source to only the preferred pre-selected precursor intermediates, a plasma more conducive to the formation of a high quality material is generated in the plasma activation region. The carrier gas is selected to avoid reactions with the preferred pre-selected precursor intermediate, so the plasma formed is enriched in activated forms of the preferred precursor intermediate. The thin film material deposited from this plasma, or a deactivated energized deposition medium derived from this plasma, is accordingly of higher quality.

In another embodiment, an initial plasma is formed from the carrier gas in the plasma activation region, transported from the plasma activation region and deactivated to form an energized carrier gas. The energized carrier gas may be viewed as an energized pre-deposition medium. One or more pre-selected preferred precursor intermediates is next delivered to the energized carrier gas to form an energized deposition medium that is transported to the substrate. At the substrate, the one or more pre-selected preferred precursor intermediates exit the energized deposition medium to form a thin film material. In this embodiment, the pre-selected precursor intermediate is not activated and is simply commingled with the energized carrier gas. The energized carrier gas may transfer energy to the pre-selected precursor intermediate to promote it to an energized state. Since the energized carrier gas is less energized than a carrier gas plasma, the extent to which the pre-selected precursor intermediate is energized is reduced in this embodiment. Accordingly, the instant inventor believes that the state of the pre-selected precursor intermediate in the deposition medium is less energized and more similar to the initial state of the pre-selected precursor intermediate at the time of delivery to the deposition apparatus. Since the pre-selected precursor intermediate is less energized, the likelihood of a transformation of the state of the pre-selected precursor intermediate due to self-interactions or self-reactions is also reduced. The net result is delivery of the pre-selected precursor intermediate to the deposition surface in a more pure and less altered state. In one embodiment, the deactivated carrier gas may be completely neutral and non-ionized.

By way of example, in one embodiment the neutral radical $SiH_3$ is the preferred pre-selected precursor intermediate derived from the precursor silane. If $SiH_3$ is delivered to a deposition apparatus and becomes activated (if injected into the plasma activation region) or energized (through energy transfer from excited or energized carrier gas species), the possibility arises that bond breakage may occur to transform $SiH_3$ to $SiH_2+H$, $SiH+2H$, or $Si+3H$. Alternatively, $SiH_3$ may combine with itself in a proton transfer reaction to form $SiH_4+SiH_2$ or may combine with H to form $SiH_2+2H$. In these instances, the preferred $SiH_3$ precursor intermediate is transformed to the potentially undesirable silylene ($SiH_2$) radical. Such interactions increase the presence of undesirable species in the deposition medium and increase the likelihood of forming defects in the as-deposited material.

By controlling the energetic state of the pre-selected preferred precursor intermediate, the likelihood of self-induced transformations of preferred precursor intermediates to less preferred or undesirable precursor intermediates is reduced and the deposition medium can be enriched in the pre-selected preferred precursor in the state intended when delivered to the deposition apparatus. As indicated hereinabove, one way to control the energetic state of the pre-selected precursor intermediate is to introduce it into the carrier gas after the carrier gas has exited the plasma activation region and deactivated to become an energized carrier gas. The energy of the deactivated carrier gas is highest as it exits the plasma activation region and decreases as it is transported in the direction of the substrate. By controlling the point of delivery to the energized carrier gas, the energetic state of the pre-selected preferred precursor intermediate can be controlled. In this embodiment, the pre-selected preferred precursor intermediate may be delivered to the deactivated carrier gas at any point between the outer boundary of the plasma activation region (the point of deactivation) and a position immediately adjacent to the substrate. A spectrum of collective energy states is available for the deactivated carrier gas and the pre-selected precursor intermediate can be introduced to interact with a particular energetic state of the deactivated carrier gas to control the influence of the deactivated carrier gas on the energetic state pre-selected precursor intermediate. Similar considerations apply when the neutral radical $GeH_3$ or other species are delivered as the preferred pre-selected precursor.

In a preferred embodiment, the energetic state of the deactivated carrier gas is insufficient to induce bond scission of the pre-selected precursor intermediate. Although the deactivated carrier gas remains energized in this embodiment, it possesses insufficient energy in its interactions with the pre-selected precursor intermediate to cleave a bond. In a further embodiment, the deactivated carrier gas possesses insufficient energy in its interactions with the pre-selected precursor intermediate to ionize it or change its state of charge. Instead, the energy transferred from the deactivated carrier gas to the pre-selected precursor intermediate affects the kinetic, rotational, vibrational and/or electronic energy state of the pre-selected precursor intermediate.

One effect of the deactivated carrier gas is to impart kinetic energy of motion to the pre-selected precursor intermediate. As described more fully hereinbelow, the deactivated carrier gas traverses a path from the plasma activation region to the substrate. The pre-selected precursor intermediate becomes entrained in the flowing deactivated carrier gas and is directed to the substrate for deposition. By controlling the energy and nature of interaction between the deactivated carrier gas and the pre-selected precursor intermediate, bond scission and ionization are avoided and the pre-selected precursor intermediate is delivered to the substrate in its intended state. In a preferred embodiment, the intended state of the pre-selected precursor intermediate is the state in which the pre-selected precursor intermediate is delivered to the deposition apparatus from a position outside of the deposition apparatus. The deactivated carrier gas is preferably moving at high velocity primarily along an axis extending from the plasma activation region to the substrate. Such trajectory insures efficient transport of the pre-selected precursor intermediate to the substrate and away from the walls or other parts of the deposition apparatus. A high velocity deactivated carrier gas also inhibits interactions of the pre-selected preferred precursor intermediate with itself.

As noted, the deactivated carrier gas may also influence the rotational, vibrational, or electronic state of the pre-selected precursor intermediate. A neutral radical R, for example, may be energized to an excited form R* through transfer of energy from the deactivated carrier gas. The mechanism of energy transfer may be through collisions, radiative transfer, or non-radiative transfer of one or more species of the deactivated carrier gas with the pre-selected precursor intermediate. Radiative transfer includes emission of a photon from one or more species of the pre-selected precursor intermediate and absorption by the pre-selected precursor intermediate. Non-radiative energy transfer includes transfer of energy from an excited electronic state of one or more species in the deactivated carrier gas to the pre-selected precursor intermediate. The species of the deactivated carrier gas return to a lower electronic state and the energy of relaxation promotes the pre-selected precursor intermediate to a higher electronic state. Non-radiative energy transfer occurs preferentially through a dipole-dipole mechanism.

In a further embodiment of the instant invention, the pre-selected preferred precursor intermediate is mixed or commingled with a carrier gas and transported to a substrate for deposition of a thin film material. In this embodiment, neither the carrier gas nor the pre-selected preferred precursor intermediate is activated. Instead, the pre-selected precursor intermediate is simply delivered to the deposition apparatus and commingled with a flowing carrier gas within the deposition apparatus or mixed with carrier gas before delivery to the deposition apparatus. The carrier gas remains in an unexcited, unionized state and entrains the pre-selected precursor intermediate through velocity of motion.

The instant invention entails identification, pre-selection and isolation of a preferred precursor intermediate followed by delivery of that intermediate to a plasma deposition apparatus. As used herein, an intermediate is or includes a metastable species derived from a neutral, atomic or molecular precursor. In a preferred embodiment, the precursor is a gas and the intermediate is a neutral radical derived from the gas. The neutral radical may be formed through bond cleavage or abstraction of one or more atoms from the precursor. Addition of energy (electromagnetic, optical, thermal, magnetic, or electrical) to a thermodynamically stable precursor may transform the precursor to an excited state that relaxes or decomposes through bond breakage or liberation of atomic or molecular fragments. In contrast to prior art plasma deposition processes, the precursor intermediate is formed outside of the deposition apparatus and is provided as the precursor source to a plasma reactor. Instead of delivering a thermodynamically stable precursor gas (e.g. $SiH_4$) to a plasma deposition system and generating a random distribution of metastable intermediates during the plasma reaction, a preferred metastable intermediate (e.g. neutral $SiH_3$ radicals) is directly provided as a feedstock or source material to the reactor. Formation of the preferred precursor intermediate occurs ex situ in the instant invention as opposed to in situ as occurs in the prior art. In one preferred embodiment, the pre-selected precursor intermediate is delivered to the plasma deposition system in a relatively pure form or in combination with inert species.

In another preferred embodiment, the pre-selected precursor intermediate is delivered to the plasma deposition system along with a fluorine additive. Fluorine may be provided in the form of molecular $F_2$, neutral F radical, a compound containing F, or an intermediate derived from a compound containing F. Compounds containing F include $SiF_xH_{4-x}$ ($SiF_4$, $SiF_3H$, $SiF_2H_2$, $SiFH_3$) and $GeF_xH_{4-x}$($GeF_4$, $GeF_3H$, $GeF_2H_2$, $GeFH_3$). The flurine additive may also be a neutral radical derived from a compound containing F. Exemplary neutral radicals include $SiF_xH_{n-x}$ or $GeF_xH_{n-x}$, where n=2 or 3 and x is at least 1. Fluorinated additives that include Si or Ge may also be used as source materials for silicon and germanium-containing thin film materials. The radical $SiF_2$, for example, may serve as a preferred precursor intermediate for the deposition of a silicon-containing material as well as a fluorine additive. As noted hereinabove, S. R. Ovshinsky discovered the beneficial effects of including fluorine in the plasma deposition of thin film materials. Fluorine promotes the regular coordination of silicon, germanium and other constituents of thin film materials, acts to passivate dangling bonds and other defects, and in appropriate quantities, acts to promote the formation of nanocrystalline, intermediate range order, or microcrystalline phases of silicon and germanium.

An embodiment of the instant invention provides deposition of a thin film material from a neutral radical as the pre-selected preferred precursor intermediate and a fluorine additive. The neutral radical and the fluorine additive may be introduced together or separately to the deposition process. $SiH_3$ and a fluorine additive (e.g. $F_2$ or F), for example, may be introduced to a deactivated carrier gas to form a fluorinated thin film material of amorphous silicon, nanocrystalline silicon, intermediate range order silicon, microcrystalline silicon, a composite material comprising amorphous silicon and microcrystalline silicon, a composite material comprising amorphous silicon and nanocrystalline silicon, or a composite material comprising amorphous silicon, microcrystalline silicon and nanocrystalline silicon as well as forms of the foregoing that include intermediate range order silicon. Corresponding germanium-containing materials may be formed from $GeH_3$ and a fluorine additive. Corresponding silicon-germanium alloy materials may also be formed from $SiH_3$, $GeH_3$ and a fluorine additive.

Since formation of an amorphous silicon material from $SiH_3$ as a preferred pre-selected precursor intermediate provides a material with a low intrinsic defect concentration, the fluorine additive is expected to be particularly effective at passivating the residual level of defects that do form and higher deposition rates result. Relatively low concentrations of fluorine additive may suffice for defect passivation. Similarly, the more regular structure of as-deposited amorphous silicon formed from $SiH_3$ is more conducive to the formation of nanocrystalline or microcrystalline silicon. The high concentration of defects in conventional plasma-deposited amorphous silicon inhibits the transformation of amorphous silicon to a more ordered nanocrystalline, intermediate range order, or microcrystalline state. The presence of a high concentration of undesirable species in a conventional plasma also inhibits direct formation of nanocrystalline, intermediate range order, or microcrystalline phases on the substrate surface. The effectiveness of fluorine as an agent for promoting the formation of microcrystalline, intermediate range order, and nanocrystalline phases of silicon, germanium, or silicon-germanium alloys is enhanced by the instant invention through a combination of higher quality (low defect concentration and more regular bonding) as-deposited material and the avoidance of deleterious species in the deposition medium through pre-selection of the preferred deposition species outside of the deposition apparatus as opposed to the in situ formation of the preferred deposition species that is accompanied by the production of deleterious species.

In a further embodiment, the pre-selected precursor intermediate may be diluted with a hydrogen additive during deposition. The hydrogen additive is preferably $H_2$ or H (neutral H radical). As indicated hereinabove, hydrogen is expected to provide benefits similar to fluorine insofar as material quality and control of phase of silicon, germanium, and silicon-germanium alloys formed in a plasma process. As noted for fluorine additives, relatively low concentrations of hydrogen are effective to provide defect passivation, bond saturation, and phase control.

Various methods for forming a preferred precursor intermediate ex situ are available. The methods will be the subject of a companion patent and generally involve selective excitation of a precursor gas over a narrow range of energies corresponding to the energy required for bond scission. In the case of $SiH_4$, for example, selective excitation with an energy of about 8.75 eV suffices to cleave an Si—H bond to form $SiH_3$+H. The $SiH_3$ product can then be separated from the proton (H) byproduct and delivered as the source material to a plasma reactor. The $SiH_3$ is an embodiment of a pre-selected precursor intermediate. As described hereinabove, the $SiH_3$ can be delivered to an activated or deactivated carrier gas and transported to a substrate for thin film deposition. By tailoring the energy to a particular bond scission reaction and avoiding excess energy, the excitation process selectively forms the preferred precursor intermediate and avoids formation of higher order, more energetic intermediates (such as $SiH_2$, which requires sufficient energy to cleave two bonds instead of one).

In an alternative embodiment, a preferred precursor intermediate or preferred fluorine or hydrogen additive may be formed ex situ as a product of a chemical process. A neutral fluorine radical, for example, can be prepared by combining $F_2$ with an electropositive element (e.g. an alkali or alkaline earth metal). The neutral fluorine radical may subsequently abstract a hydrogen from silane to form $SiH_3$. The intermediates $SiF_2$ and SiHF can be formed, for example, from a reaction of silane ($SiH_4$) with fluorine gas ($F_2$).

The invention provides an apparatus and method for forming thin film materials from a pre-selected preferred precursor intermediate. The pre-selected precursor intermediate is selected according to its tendency to provide a high quality photovoltaic material and introduced to a deposition apparatus in the absence of deleterious species. In one embodiment, the preferred species for photovoltaic material deposition are neutral radicals and the instant invention provides a method and apparatus for delivery of pre-selected neutral radicals to an inert carrier gas in a deposition process. While not wishing to be bound by theory, ions and ion-radicals are generally believed to be detrimental to the quality of thin film materials, including amorphous silicon and other photovoltaic materials. By virtue of their charge, ions and ion-radicals tend to undergo high energy collisions with a deposited layer of a thin film material. The high energy collisions tend to create defects in a thin film material during deposition by breaking bonds (such as Si—H bonds), ejecting atoms or clusters, or inducing non-tetrahedral structural distortions.

Ions and ion-radicals also have high sticking coefficients and are more likely to remain on the surface of as-deposited material at the point of impact, even if the bonding configuration at the point of impact is structurally or coordinatively non-optimal. Neutral radicals, in contrast, impinge the surface of as-deposited material with lower energy, cause less damage, and create fewer defects. The sticking coefficient of neutrals is also lower than that of ions or ion-radicals, which means that neutrals that initially incorporate in a non-optimal bonding configuration have a lower activation to surface mobility and are more likely to migrate on the surface to encounter an optimal, energetically preferred bonding site during processing. The concentration of intrinsic defects is lowered accordingly.

Thin film materials that can be prepared according to the method and apparatus of the instant invention include amorphous silicon; fluorinated amorphous silicon; hydrogenated amorphous silicon; amorphous germanium; hydrogenated amorphous germanium; fluorinated amorphous germanium; amorphous silicon-germanium alloys as well as hydrogenated and fluorinated forms thereof, nanocrystalline, microcrystalline, intermediate range order, and polycrystalline forms of silicon, germanium, silicon-germanium alloys as well as hydrogenated and fluorinated forms thereof, composite materials that combine one or more of the amorphous, nanocrystalline, microcrystalline, intermediate range order, or polycrystalline forms of the foregoing; and n-type or p-type variations of the foregoing achieved by doping with, for example, column III (e.g. B, Al, Ga, In) or column V (e.g. P, As, Sb) elements.

In one embodiment, the method of the instant application includes the following general steps: (1) provision of a carrier gas (e.g. one or more of He, Ne, Ar, Kr, Xe, $H_2$) at high or transonic velocity to a plasma activation region within a deposition apparatus; (2) forming a plasma from the carrier gas in the plasma activation region; (3) delivery of the carrier gas plasma to an interaction region by creating a pressure differential between the plasma activation region and the interaction region to direct the activated species of the carrier gas plasma to the interaction region and to maintain adequate velocity of motion to provide the activated species of the carrier gas to the interaction region without significant decay or transformation; (4) pre-selection and isolation of one or more preferred intermediates derived from a precursor gas at a point external to the deposition apparatus; (5) supplying the pre-selected precursor intermediate to the deposition apparatus; (6) commingling the pre-selected precursor intermediate with the carrier gas at the interaction region; and (7) entrainment and transport of the pre-selected precursor intermediate by the carrier gas to a substrate for high rate deposition of a high quality thin film material. The deposition medium provided to the substrate is enriched in the pre-selected preferred precursor intermediate relative to a conventional process in which the precursor gas is either activated in the plasma activation region or introduced to a deactivated carrier gas. In a preferred embodiment, the interaction zone is located outside of the plasma activation region so that the carrier gas plasma has deactivated to form an energized (ionized or non-ionized) medium at the time of commingling with the pre-selected precursor intermediate.

Figure 3:
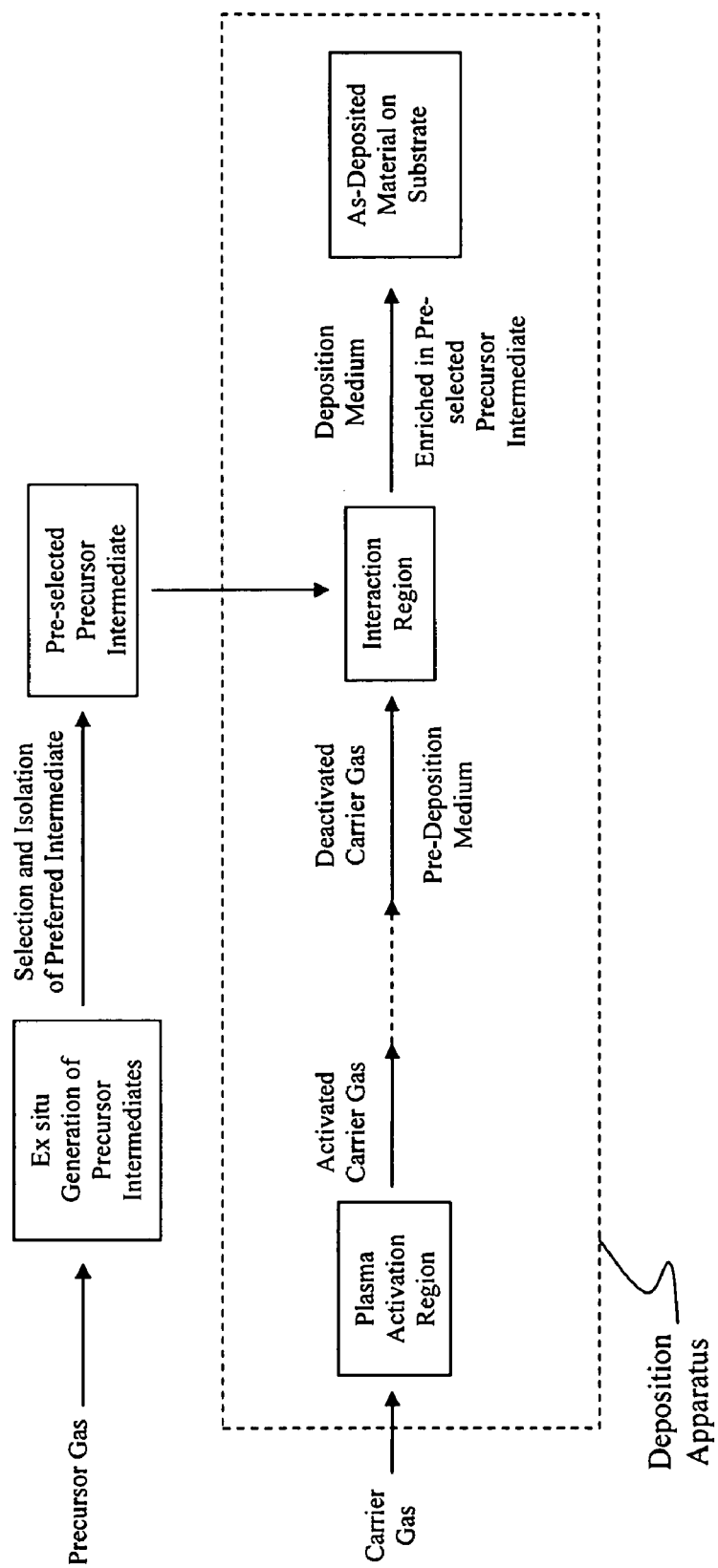
FIG. 3 is a schematic depiction of a flow process that provides a pre-selected precursor intermediate to a deactivated carrier gas to form an enriched deposition medium for deposition of a thin film material on a substrate.

FIG. 3 depicts the general steps of one embodiment of the instant invention. The basic steps of this embodiment include: (1) providing a carrier gas at transonic velocity (preferably at conditions near the minimum of the modified Paschen curve) to a plasma activation region of a deposition apparatus; (2) initiating a plasma from the carrier gas to form an activated carrier gas; (3) transport of the activated carrier gas toward a substrate and deactivation of the carrier gas to form a pre-deposition medium; (4) delivering one or more pre-selected precursor intermediates to an interaction region of the deposition apparatus; (5) commingling of the pre-selected precursor intermediate and deactivated carrier gas at the interaction region to form a deposition medium; and (6) directing the deposition medium to a substrate and forming a thin film material thereon.

FIG. 3 further depicts the optional upstream processes of selecting a precursor gas, reacting or exciting the precursor gas to generate one or more intermediate species external to the deposition apparatus, and selecting and isolating a preferred precursor intermediate. In an alternative embodiment, the pre-selected precursor intermediate is commingled with the carrier gas in the activated state.

Figure 2:
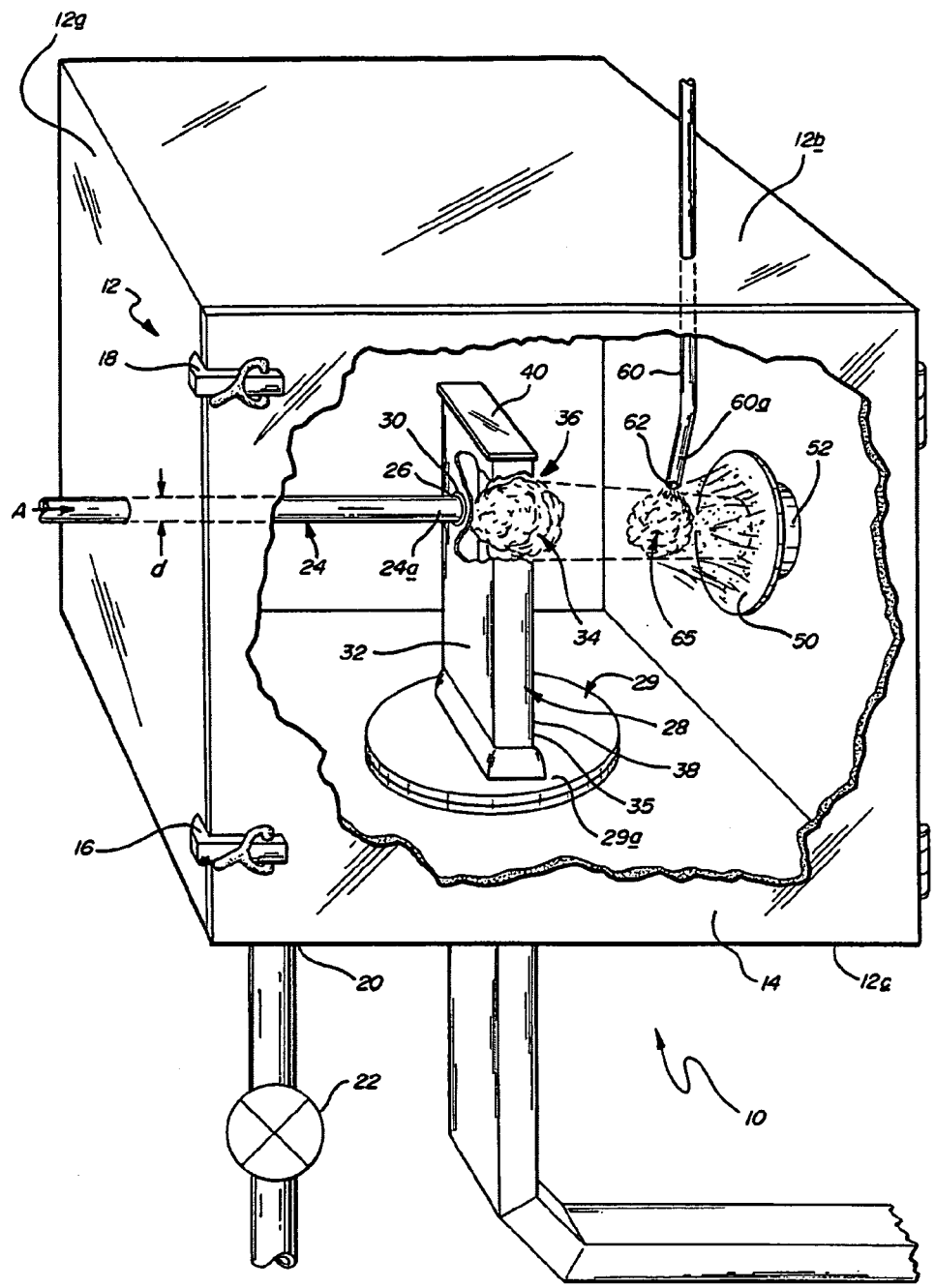
FIG. 2 is a schematic depiction of a deposition apparatus for the deposition of a thin film material from a pre-selected precursor intermediate and an energized carrier gas.

A schematic depiction of an illustrative apparatus and method in accordance with an embodiment of the instant invention is shown in FIG. 2. FIG. 2 depicts a perspective view, partially cut-away, of a deposition apparatus 10 that is adapted to generate a plasma plume from a carrier gas and contact it with a pre-selected precursor intermediate according to one embodiment of the instant invention. The apparatus 10 includes an evacuable enclosure 12 with a pivotally mounted front face 14 which functions as a door for loading and removing substrates from the interior of the enclosure. The inner periphery of the door 14 is equipped with one or more vacuum seal rings (not shown) and one or more latches, such as 16 and 18, that are adapted to compress the seal rings for assuring airtight closure of the enclosure 12. The evacuated enclosure 12 further includes a pump-out port 20 in the bottom wall 12c thereof adapted for connection to a vacuum pump 22 which is employed to: (1) exhaust depleted reaction products and (2) to maintain the interior of enclosure 12 at an appropriate sub-atmospheric background pressure. As will be explained in greater detail hereinbelow, the background pressure is carefully selected to initiate and sustain the high rate deposition process occurring within the interior of the enclosure.

The apparatus 10 further includes at least a first elongated conduit 24 of diameter d, where d is preferably between about 0.5 to 3.0 cm, that extends through a side wall 12a into the interior of evacuated enclosure 12. First conduit 24 includes a distal end portion 24a having an aperture 26 formed therein. First conduit 24 and aperture 26 are adapted to, respectively, transmit and introduce a carrier gas from a source (not shown) into the interior of evacuated enclosure 12 to a plasma activation region adapted to create activated species from the carrier gas.

In one embodiment, first conduit 24 is adapted to introduce a carrier gas.

Representative carrier gases include hydrogen ($H_2$) neon (Ne), helium (He), argon (Ar), krypton (Kr), xenon (Xe), or combinations thereof. In a preferred embodiment, the carrier gas is chemically inert with respect to the pre-selected precursor intermediate. Optionally, the carrier gas may also include one or more diluent, treatment (e.g. hydrogenation or fluorination), or dopant (including n-type or p-type) gases, including, but not limited to, $O_2$, $NH_3$, $N_2$, $NH_3$, $PH_3$, $PH_5$, $SF_6$, $BF_3$, $B_2H_6$, $BH_3$, $SiF_4$, $F_2$, $GeF_4$, and combinations thereof.

Regardless of the composition of the carrier gas, aperture 26 formed at distal end 24a of first conduit 24 must be capable of delivering the carrier gas at a preferred flow rate. The flow rate is selected to provide a sufficient pressure of the carrier gas at aperture 26 for initiating the plasma activation of the carrier gas at a power-pressure-aperture size regime which is at or near the minimum of the modified Paschen curve.

First conduit 24 may further include means for constricting the flow path of the carrier gas to create a "choke-condition" in first conduit 24 adjacent to aperture 26 so as to provide a localized high pressure of the carrier gas. As used herein, the term "choke condition" refers to the condition that occurs when the speed of the carrier gas passing through aperture 26 of first conduit 24 reaches transonic speed. The choke condition generally is that condition that occurs in compressible gas or fluid flow when, for a conduit of a uniform size, the speed of the gas passing through said conduit reaches transonic velocity. At the choke condition, a rise in the mass flow rate of the carrier gas results in an increase in pressure rather than velocity. Operation in choke mode permits control over the pressure of the carrier gas and provides the degree of freedom in operating conditions needed to establish a condition at or near the minimum of the Paschen curve. The localized high pressure established at aperture 26 creates a zone of sufficient pressure of the carrier gas as it exits aperture 26 to enable initiation of a plasma. In an alternative embodiment, the pressure at or near aperture 26 may be controlled by employing a solenoid valve within first conduit 24, where the solenoid valve may be selectively constricted or relaxed to regulate the flow rate and pressure of the carrier gas as it passes through aperture 26.

Note that the activated species of the carrier gas form a plume of pressure isobars adjacent to aperture 26 of first conduit 24. The plume defines a plasma activation region 34 in which conditions permit plasma initiation and formation of activated species that include ions, ion-radicals and neutral radicals in conventional proportions. The boundaries of the plume of activated species 34 are governed by the pressure differential that exists between the gas flowing through the interior of first conduit 24 adjacent to aperture 26 and the background pressure of enclosure 12. As should be apparent, material that is sputtered or ablated from the surface of first conduit 24 would degrade the quality of the activated species in plume 34 by providing undesirable impurities or other deleterious species that could be delivered to the deposition surface and incorporated into the as-deposited amorphous semiconductor. Thus, a protective overcoat is preferably fabricated over the surface of first conduit 24. The protective overcoat is preferably formed from a material that is resistant to a high temperature plasma environment; or alternatively, from a material that would be relatively benign when incorporated into the as-deposited film. In one embodiment, graphite or carbon is employed as the material from which the protective overcoat is fabricated.

Deposition apparatus 10 further includes microwave applicator 28 that is adapted to deliver electromagnetic energy at a microwave frequency (e.g. 2.45 GHz) to the energy transferring gas flowing through first conduit 24. While applicator 28 is depicted as a radiant microwave applicator in FIG. 2, the applicator may be selected to deliver any type of energy, including DC energy, microwave energy, radiofrequency (rf) energy, low frequency AC energy, or other electromagnetic energy (e.g. in the form of a high intensity pulsed laser). A plasma in accordance with the instant invention may be formed from electromagnetic energy over the frequency range from 0 Hz to 5 GHz. Since microwave energy can effectively provide a large-volume plasma that contains a high density of activated species, applicator 28 is preferably formed as a microwave applicator. Preferably, applicator 28 is a radiant microwave applicator (as opposed to slow-wave applicator) adapted to transmit at least 1.0 kilowatt of microwave power and preferably 5 kilowatts or more of microwave power at a frequency of 2.45 GHz.

As indicated in FIG. 2, applicator 28 is an elongated, hollow, generally rectangular waveguide structure adapted to transmit microwave energy from a magnetron (not shown) to the energy transferring gas introduced into enclosure 12 from first conduit 24. Applicator 28 may be formed from a material such as nickel or nickel-plated copper. Applicator 28 enters enclosure 12 through a microwave transmissive window 29, which window is vacuum sealed to a bottom face 12c of enclosure 12. This type of vacuum sealed window 29 is fully disclosed and well known in the art. Applicator 28 is seated upon the upper, interior plate 29a of window 29.

In order to couple the microwave energy to the carrier gas, first conduit 24 extends through an aperture 30 formed in the side face 32 of applicator 28 to deliver the carrier gas. Aperture 30 is adapted to direct first conduit 24 and the carrier gas carried to plasma activation region 34 formed adjacent to aperture 26 of first conduit 24 so that the plume of activated species extends from the interior of applicator 28.

Applicator 28 further includes cut-away section 36 formed in face 35 opposite face 32 in which aperture 30 is formed. Cut-away section 36 has a diameter larger than the diameter of aperture 30 and preferably at least about 2 inches so as to provide for the expansion and movement of pressure isobars of plume 34 of activated species through and from applicator 28 while avoiding interaction of the activated species with the walls of applicator 28 to prevent both incorporation of the material of construction of applicator 28 into the plume 34 as it exits applicator 28 and deterioration of applicator 28. It should therefore be understood that the applicator cut-away section 36 is adapted to provide a means of directed escape for the activated species of the carrier gas from within applicator 28. Applicator 28 further includes a closed end plate 40 to prevent the escape of unused microwave energy into the interior of evacuated enclosure 12. Considerations relevant to establishing the size of cut-away section 36 include: (1) recognition that the smaller the opening is made in face 35, the greater the amount of material etched from face 35, but the better the microwave energy is confined within applicator 28 and prevented from leaking into enclosure 12, while (2) the larger the opening is made in face 35, the lesser the amount of material etched from face 35, but the more the microwave energy leaks into enclosure 12. Cutaway section 36 may further include a microwave absorptive or reflective screen or other means adapted to prevent the microwave energy from escaping applicator 28 and entering enclosure 12. This becomes particularly significant as the pressure differential between the background pressure and the pressure of the carrier gas in first conduit 24 is reduced to approach the aforementioned factor of at least 5.

Deposition apparatus 10 further includes at least one remotely located, generally planar substrate 50 operatively disposed within enclosure 12 to provide a surface for the deposition of a thin film material. Planar substrate 50 is spaced at a distance from plasma activation region 34 sufficient to prevent the depositing thin film material from direct exposure to the electrons present in plasma activation region 34. Electrons in plasma activation region 34 have high energy and inflict severe damage on the thin film material as it deposits.

Apparatus 10 may further optionally include means 52 adapted to heat and or apply an electrical or magnetic bias to substrate 50. It is to be understood, however, that the use of heat or a bias is not required to practice the invention disclosed herein. In a preferred embodiment, substrate 50 is operatively disposed so as to be substantially aligned with first conduit 24 so that a flux of the activated species generated in the activation region 34 can be directed threat for deposition thereupon.

Deposition apparatus 10 is also equipped with means for introducing a pre-selected precursor intermediate into enclosure 12. In the embodiment shown in FIG. 2, deposition apparatus 10 is equipped with a second elongated, hollow conduit 60 having at least one aperture 62 formed at the distal end 60a thereof. Aperture 60a of second conduit 60 extends through top wall 12b of enclosure 12 into the interior thereof so that aperture 62 terminates in close proximity to substrate 50. Second conduit 60 is adapted to deliver a flow of a pre-selected precursor intermediate from a source (not shown) into an interaction region 65 which is created adjacent to substrate 50. Interaction region 65 is disposed between substrate 50 and plasma activation region 34 and in the embodiment of FIG. 2, generally represents the region in which the deactivated carrier gas interacts with the pre-selected precursor intermediate exiting aperture 62 of second conduit 60. Interaction region 65 is disposed adjacent to substrate 50 and the medium formed by the interaction of the deactivated carrier gas and the pre-selected precursor intermediate constitutes a deposition medium from a thin film material is deposited on substrate 50.

As described hereinabove, the pre-selected precursor intermediate introduced via conduit 60 is typically a neutral radical derived from a silicon or germanium precursor gas. Representative silicon or germanium precursor gases from which the pre-selected precursor intermediate may be formed include $SiH_4$, $Si_2H_6$, $SiF_4$, $GeH_4$, $Ge_2H_6$, and $GeF_4$. As indicated hereinabove, the pre-selected precursor intermediate may be introduced alone or in combination with a fluorine additive, a hydrogen additive, or an intermediate species derived from a fluorine additive or hydrogen additive. Representative fluorine or hydrogen additives include $SiF_4$, $GeF_4$, $SiF_{4-x}H_x$, $GeF_{4-x}H_x$, $F_2$, and $H_2$. The pre-selected precursor intermediate may also be introduced in combination with a dopant precursor or intermediate derived from a dopant precursor to provide a thin film material having n-type or p-type characteristics. Dopant-containing gases include $CH_4$, $C_2H_6$, $BH_3$, $B_2H_6$, $PH_3$, $BF_3$, and $SF_6$. The pre-selected precursor intermediate may also be accompanied by an inert diluent gas. The flow rate of the pre-selected precursor intermediate is typically at least about 10 sccm and normally between about 10 and 200 sccm.

As noted, the pre-selected precursor intermediate is introduced by second conduit 60 into interaction region 65. Interaction region 65 is disposed in the path of travel of the deactivated species of the carrier gas that exit plasma activation region 34 and are directed toward substrate 50. In interaction region 65, the deactivated carrier gas collides or otherwise interacts with the one or more pre-selected precursor intermediates introduced via conduit 60. As described hereinabove, the interaction of a neutral precursor intermediate with the deactivated carrier gas may energize the neutral precursor intermediate. By controlling the energetic state of the deactivated carrier gas or the point of interaction of the deactivated carrier gas with the pre-selected intermediate, ionization or other modification of the pre-selected intermediate can be avoided so that the primary effect of the deactivated carrier gas is to provide momentum to the pre-selected intermediate to efficiently transfer it to the substrate for thin film deposition.

Interaction region 65 is preferably disposed at the necessary distance from substrate 50 to insure that the pre-selected precursor intermediate introduced to interaction region 65 will deposit uniformly over the entire surface of substrate 50 without undergoing significant modifications or other interactions with itself. Multiple collisions or interactions of or between the preferred pre-selected precursor intermediate increase the likelihood of transforming the pre-selected precursor intermediate to an ion, ion-radical, or other undesired or less desirable species.

It should also be noted that as the pressure changes from the activation region to the collision region, so does the mean-free-path length of the species of the deactivated carrier gas and pre-selected precursor intermediate. The mean-free path increases as the pressure decreases in the direction from activation region 34 to interaction region 65 to substrate 50 such that a plasma can be sustained in plasma activation region 34, but not in interaction region 65 or the region adjacent to substrate 50. In one embodiment, the background pressure to which enclosure 12 is evacuated provides for a mean-free path of approximately 1-15 cm for neutral free radical species of the carrier gas or precursor intermediate at interaction region 65. Therefore, by spacing the substrate a distance of 1-15 cm from the interaction region in one embodiment, the entire surface thereof will be covered with a uniform thin film of material and the likelihood of collisions or interactions of a neutral radical pre-selected precursor intermediate with itself or species of the deactivated carrier gas is minimized. By adjusting the background pressure and temperature of the deposition apparatus, the mean free path may be adjusted from about 1 mm to about 5 m.

As indicated hereinabove, it is desirable to form the carrier gas plasma at conditions at or near the minimum of the modified Paschen curve. In one embodiment, this objective is achieved by maintaining a pressure differential of at least a factor of five between the pressure at distal end 24a (or aperture 26) of first conduit 24 and the background pressure that exists within enclosure 12. Generally the background pressure of enclosure 12 is less than about 50 torr and preferably between 0.01 mtorr to 10 mtorr. In one range of background pressure of enclosure 12, the pressure proximate distal end 24a or aperture 26 of first conduit 24 is at or below 30 torr. The flow rate of the carrier gas in first conduit 24 also influences the pressure differential and may be kept in the range between 100-2000 sccm. As is known to those of skill in the art, the pressure within any given isobar decreases with increasing distance away from distal end 24a or aperture 26 of first conduit 24. Therefore, at any given power, the slope of the Paschen curve will provide a pressure-determined boundary of the activation region.

In a further embodiment, the instant invention optionally provides a process control system and method. The process control system and method includes a diagnostic element and a feedback control element. The process control system may be open loop or closed loop. The diagnostic element permits sensing of the distribution of species at various points in the deposition process and the feedback control element receives process data from the diagnostic element, compares the process data to data for pre-determined optimum conditions, and adjusts process conditions as necessary to insure that optimal conditions are maintained in real time.

The diagnostic element includes means for sensing the composition and distribution of species of the carrier gas, the activated carrier gas, the deactivated carrier gas, the pre-selected precursor intermediate, the deposition medium formed upon commingling of an activated or deactivated carrier gas with the pre-selected precursor intermediate, and/or the as-deposited thin film materials of the instant invention. Detection of the composition and species at various points in the process may occur by placing sensors within enclosure 12 or at delivery points outside of enclosure 12. The diagnostic element may include chemical or elemental sensors for detecting the composition and purity of the carrier gas, precursor intermediate, or species derived therefrom. Detrimental charged species (ions and ion-radicals) may be detected by electrostatic or magnetic means. Neutral radicals and ion-radicals may be sensed by means capable of detecting the presence of free electrons, such as electron spin resonance. In one embodiment, the diagnostic element includes a mass spectrometer as a monitor for quality control for detecting the identify of and relative proportions of detrimental ions, detrimental ion-radicals, and desired neutrals at various points in the process, including in the plasma activation region, the point of introduction of the pre-selected precursor intermediate, the collision region, and in the region adjacent to the substrate during thin film growth.

The diagnostic element may also include a unit for probing the composition or characteristics of the as-deposited thin film material. An optical probe may be used to assess the quality of the as-deposited thin film material since the presence of defects in the as-deposited material may be reflected in its optical properties. The optical probe may be a conventional broadband or monochromatic light source (e.g. tungsten-halogen lamp), a light emitting diode, or a laser. The optical probe may be an absorption or transmission technique, a light scattering method, or a reflection method. Ellipsometry provides information about the optical constants (refractive index, absorption coefficient, dielectric constant) of the as-deposited material. Optical absorption spectroscopy provides information about the band gap and the presence of certain midgap defect states. Light scattering techniques can detect the presence of certain midgap defects. The dihydride defect in amorphous silicon, for example, has an intense fingerprint signature at ~2100 $cm^{-1}$ that is detectable in Raman scattering. The thin film material preferably has a non-single crystal microstructure with a midgap defect concentration of less than $5 \times 10^{16}$ $cm^{-3}$. More preferably, the material has a midgap defect concentration of less than $1 \times 10^{16}$ $cm^{-3}$. Most preferably, the material has a midgap defect concentration of less than $5 \times 10^{15}$ $cm^{-3}$.

Information obtained from the diagnostic element is transmitted to a feedback control element. The feedback control element permits real-time control of process conditions based on information provided by the diagnostic element. Calibrations and correlations of process conditions with the quality of the as-deposited film can be developed and utilized by the feedback control element to optimize process conditions during deposition. As an example, the optical constants, optical absorption, transmittance, reflection, luminescence, and light scattering characteristics of high quality amorphous silicon and other amorphous semiconductors are known and can be compared to measurements made in real time by the instant optical diagnostic unit to assess the quality of as-deposited material. Correlations of process conditions with optical properties can be developed and incorporated into the feedback control element to adjust process conditions as needed. Similar correlations can be developed from mass spectrometry or other data that characterizes the identity and concentration of ions, ion-radicals, and neutrals as a function of position in a deposition apparatus.

The feedback control element receives real-time data from the diagnostic element and compares this data to target conditions known to correlate with high quality as-deposited material. If the real-time data deviates from the target conditions to an unacceptable degree, the feedback control element includes the capability to adjust process conditions to better conform to the target conditions.

The feedback control element can adjust the mass flow rate of the carrier gas or pre-selected precursor intermediate as well as the presence and amount of diluent gases, hydrogen additive, or fluorine additive. The feedback control element can also control the energy and frequency of electromagnetic radiation used to form plasmas in the instant deposition apparatus. The motion of the plasma, activated carrier gas, deactivated carrier gas, pre-selected precursor intermediate, pre-deposition medium, and deposition medium can be controlled by controlling the background pressure in the deposition enclosure and the pressure differential across the deposition apparatus. A higher pressure differential provides greater velocity and energy of motion. Control of the pressure also influences the mean-free path of motion for ions, ion-radicals, and neutrals and permits the ability to regulate the extent of collisions between species of the pre-deposition medium and deposition medium before reaching the growth surface at the substrate.

In another embodiment, the feedback control element regulates the temperature of the substrate. The temperature of the substrate influences the structure and intrinsic defect concentration of the as-deposited material. Higher substrate temperatures, for example, tend to improve the quality of the as-deposited material by annealing defects. Higher substrate temperatures, however, also tend to diminish the deposition rate by promoting volatilization of material from the surface. The instant feedback control element can make judicious use of temperature by monitoring one or more intrinsic defects of the as-deposited material (e.g. via an optical probe) and temporarily increasing the substrate temperature in response to a detected increase in defect concentration.

In addition to stationary substrates, the methods and principles of the instant invention further extend to mobile, continuous web depositions as well as to deposition processes that require multiple deposition chambers. In these embodiments, a web of substrate material may be continuously advanced through a succession of one or more operatively interconnected, environmentally protected deposition chambers, where each chamber is dedicated to the deposition of a specific layer of semiconductor alloy material onto the web or onto a previously deposited layer situated on the web. By making multiple passes through the succession of deposition chambers, or by providing an additional array of deposition chambers, multiple stacked cells of various configurations may be obtained and the benefits arising from the instant invention of supplying a pre-selected precursor intermediate may be achieved for multiple compositions within a multilayer device. Different chambers of a deposition apparatus, for example, may be provided with different pre-selected precursor intermediates to form an electronic device having multiple layers differing in composition.

An important photovoltaic device, for example, is the triple junction solar cell, which includes a series of three stacked n-i-p devices with graded bandgaps on a common substrate. The graded bandgap structure provides more efficient collection of the solar spectrum. In making an n-i-p photovoltaic device, a first chamber is dedicated to the deposition of a layer of an n-type semiconductor material, a second chamber is dedicated to the deposition of a layer of substantially intrinsic (i-type) amorphous semiconductor material, and a third chamber is dedicated to the deposition of a layer of a p-type semiconductor material. The process can be repeated by extending the web to six additional chambers to form a second and third n-i-p structure on the web. Bandgap grading is achieved by modifying the composition of the intrinsic (i-type) layer. Bandgap grading may also be achieved through alloying of silicon or nitrogen with nitrogen. In one embodiment, the highest bandgap in the triple junction cell results from incorporation of amorphous silicon as the intrinsic layer in one of the n-i-p structures. Alloying of silicon with germanium to make amorphous silicon-germanium alloys leads to a reduction in bandgap. In one embodiment, the second and third n-i-p structures of a triple junction cell include intrinsic layers comprising SiGe alloys having differing proportions of silicon and germanium. Multiple precursor gases may be delivered simultaneously to the instant deposition apparatus to form alloys. Bandgap modification may also be achieved through control of the microstructure of the intrinsic layer. Polycrystalline silicon, for example, has a different bandgap than amorphous silicon and multilayer stacks of various structural phases may be formed with the instant continuous web apparatus. Nanocrystalline silicon can provide bandgaps above the bandgap of crystalline silicon and below the bandgap of amorphous silicon that have direct character or that permit relaxation of selection rules. As indicated above, inclusion of fluorine in the deposition process promotes the formation of nanocrystalline, intermediate range order, and microcrystalline phases. In addition to triple junction devices, tandem devices are achievable with the instant invention.

Another important multilayer structure is the p-n junction. As indicated hereinabove, in conventional amorphous silicon or conventional hydrogenated amorphous silicon, the hole mobility is too low to permit efficient operation of a p-n junction. The low hole mobility is a consequence of a high defect density that rapidly traps photogenerated carriers before they can be withdrawn as external current. To compensate for carrier trapping, an i-layer is often included in the structure. With the material prepared by the instant invention, the defect concentration is greatly reduced and efficient p-n junctions can be formed from silicon, germanium, and silicon-germanium alloys. Alternatively, p-i-n structure can be formed in which the i-layer thickness necessary for efficient charge separation is much smaller that is required for current devices.

In one embodiment, the deposition apparatus includes a first chamber for depositing a silicon-containing thin film material and a second chamber for depositing a germanium-containing thin film material. In the first chamber, $SiH_3$ is introduced as the pre-selected precursor intermediate and in the second chamber, $GeH_3$ is introduced as the pre-selected precursor intermediate. Either or both chambers may further include provision of a hydrogen or fluorine additive.

The instant invention allows for a tremendous increase in the throughput and film formation rate in continuous web deposition processes. With the invention, the web speed can be increased without sacrificing the quality of the deposited thin film layers by minimizing intrinsic defects through the delivery of a neutral-enriched pre-selected preferred precursor intermediate as a source material to a deposition process. The instant invention permits an expansion of the current manufacturing capacity to the gigawatts regime through a substantial increase in deposition rate from the current state of the art. Deposition rates exceeding 400 Å/s may be achieved using the principles of the present invention. In one embodiment, deposition rates of 20-50 Å/s are achieved. In another embodiment, deposition rates of 50-150 Å/s are achieved. In still another embodiment, deposition rates of 150-400 Å/s are achieved. It is important to note that these deposition rates can be achieved without significantly impairing the quality of the deposited thin film material. By forming a thin film material according to the principles of the instant invention, the formation of defects is inhibited and the deposition rate becomes decoupled from the quality of the material. By pre-selecting a preferred precursor intermediate and delivering that intermediate to the deposition process in the absence of detrimental species, defects are avoided and the need to reduce the deposition rate or to incorporate time-consuming ancillary defect remediation steps in the process is eliminated. The material quality and characteristics such as photovoltaic efficiency become and remain optimal over a wide range of deposition rates.

Figure 4:
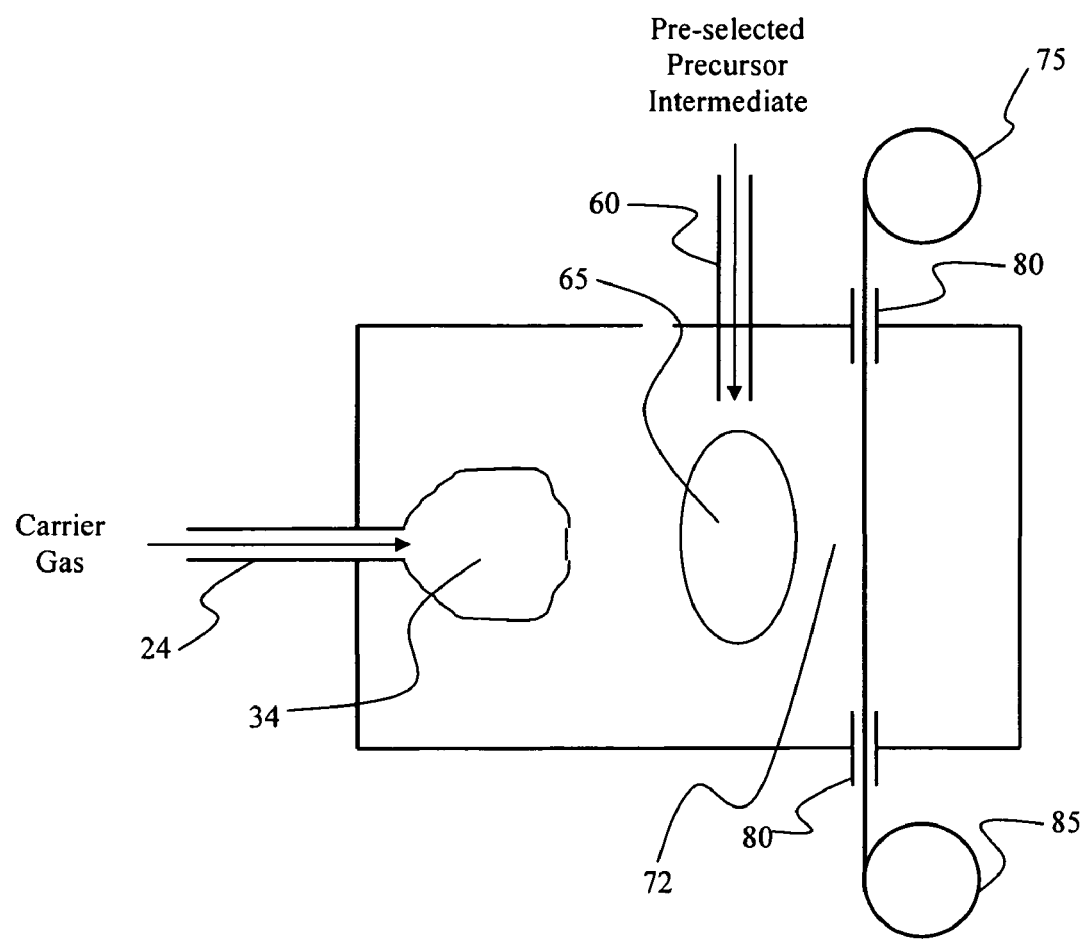
FIG. 4 is a schematic depiction of a continuous web embodiment according to the principles of the instant invention.

FIG. 4 depicts a continuous web deposition apparatus consistent with the embodiment shown in FIG. 3. The deposition apparatus 10 includes mobile, continuous web substrate 50 that is dispensed by payoff roller 75, enters and exits enclosure 12 through gas gates 80, and is picked up by take up roller 85. Continuous substrate 50 may be formed from steel, a plastic (e.g. Mylar or Kapton), or other durable material. As substrate 50 passes into and out of deposition apparatus 10, a thin film material may be deposited thereon according to the principles described hereinabove. The carrier gas enters conduit 24. A plasma of the carrier gas is formed in plasma activation region 34 and interacts with a pre-selected precursor intermediate in collision region 65 to form a deposition medium in region 72. A thin film material is formed on web substrate 50 as it passes through enclosure 12. A plurality of enclosures of the type 12 may be connected in series for the continuous formation of multi-layered devices.

Those skilled in the art will appreciate that the methods and designs described above have additional applications and that the relevant applications are not limited to the illustrative examples described herein. The present invention may be embodied in other specific forms without departing from the essential characteristics or principles as described herein. The embodiments described above are to be considered in all respects as illustrative only and not restrictive in any manner upon the scope and practice of the invention. It is the following claims, including all equivalents, which define the true scope of the instant invention.

I claim:

1. A method of forming a thin film material comprising:
providing a deposition chamber,
delivering a carrier gas to said deposition chamber;
forming a plasma from said carrier gas, said plasma being formed in a plasma activation region of said deposition chamber;
directing said carrier gas plasma to a substrate disposed in said deposition chamber, said substrate being positioned outside of said plasma activation region, said carrier gas exiting said plasma activation region and deactivating;
delivering a first intermediate to said deactivated carrier gas, said first intermediate including a first metastable species, said first intermediate being formed outside of said deposition chamber and not passing through said plasma activation region; and
forming a first thin film material on said substrate, said thin film material including an element provided by said first metastable species.

2. The method of claim 1, wherein said first metastable species comprises a neutral radical.

3. The method of claim 1, wherein said first metastable species comprises silicon.

4. The method of claim 3, wherein said first metastable species includes $SiH_3$.

5. The method of claim 3, wherein said first metastable species consists essentially of $SiH_3$.

6. The method of claim 3, wherein said first metastable species includes $SiF_3$.

7. The method of claim 1, wherein said first metastable species comprises germanium.

8. The method of claim 7, wherein said first metastable species includes $GeH_3$.

9. The method of claim 1, wherein said first intermediate includes only one metastable species.

10. The method of claim 1, wherein said first intermediate includes only two metastable species.

11. The method of claim 1, wherein said first intermediate further comprises a diluent gas.

12. The method of claim 11, wherein said diluent gas comprises hydrogen.

13. The method of claim 11, wherein said diluent gas comprises a noble gas.

14. The method of claim 1, wherein said first thin film material includes an amorphous region.

15. The method of claim 14, wherein said first thin film material further includes a nanocrystalline region.

16. The method of claim 15, wherein said nanocrystalline region comprises silicon.

17. The method of claim 14, wherein said first thin film material further includes a microcrystalline region.

18. The method of claim 17, wherein said microcrystalline region comprises silicon.

19. The method of claim 14, wherein said amorphous region comprises silicon.

20. The method of claim 19, wherein said amorphous region further comprises hydrogen.

21. The method of claim 19, wherein said amorphous region further comprises germanium.

22. The method of claim 1, further comprising delivering a hydrogen additive to said deposition chamber.

23. The method of claim 22, wherein said hydrogen additive includes $H_2$.

24. The method of claim 22, wherein said first thin film material comprises hydrogen, said hydrogen being provided by said hydrogen additive.

25. The method of claim 24, wherein said first thin film material comprises hydrogenated amorphous silicon, hydrogenated nanocrystalline silicon, or hydrogenated microcrystalline silicon.

26. The method of claim 1, further comprising delivering a fluorine additive to said deposition chamber.

27. The method of claim 26, wherein said fluorine additive is selected from the group consisting of $F_2$, HF, $SiF_xH_{4-x}$ (x=1–4) and $GeF_xH_{4-x}$ (x=1–4).

28. The method of claim 26, wherein said first thin film material comprises fluorine, said fluorine being provided by said fluorine additive.

29. The method of claim 28, wherein said first thin film material comprises fluorinated amorphous silicon, fluorinated nanocrystalline silicon, or fluorinated microcrystalline silicon.

30. The method of claim 1, wherein said carrier gas is selected from the group consisting of $H_2$, Ar, He, Kr, Xe, and Ne.

31. The method of claim 1, wherein said carrier gas is delivered at a transonic velocity to said deposition chamber.

32. The method of claim 1, further comprising combining said carrier gas with said first intermediate, the momentum of said carrier gas directing said first intermediate to a substrate disposed in said deposition chamber, said first thin film material being formed on said substrate.

33. The method of claim 1, wherein said plasma is formed by applying electromagnetic energy to said energy transferring gas, said electromagnetic energy having a DC frequency or a frequency in the radiofrequency or microwave portion of the electromagnetic spectrum.

34. The method of claim 1, wherein said plasma activation region comprises a pore cathode.

35. The method of claim 1, wherein said substrate is in motion during said formation of said first thin film material.

36. The method of claim 1, further comprising delivering a doping precursor to said deposition chamber, said doping precursor providing a dopant to said first thin film material.

37. The method of claim 36, wherein said doping precursor comprises boron, phosphorous, gallium, indium, or antimony.

38. The method of claim 1, further comprising detecting the amount of said first metastable species in said deposition chamber.

39. The method of claim 38, further comprising comparing said amount to a target amount.

40. The method of claim 39, further comprising modifying a process parameter of said method in response to said comparison.

41. The method of claim 40, wherein said process parameter is one or more of the group consisting of the flow rate of said first intermediate, the amount of said first metastable species within said first intermediate, and the background pressure of said deposition chamber.

42. The method of claim 1, wherein the defect concentration of said first thin film material is less than $5 \times 10^{16}$ cm$^{-3}$.

43. The method of claim 42, wherein the deposition rate of said first thin film material is greater than or equal to 100 Å/s.

44. The method of claim 43, wherein the deposition rate of said first thin film material is greater than or equal to 300 Å/s.

45. The method of claim 44, wherein the deposition rate of said first thin film material is greater than or equal to 400 Å/s.

46. The method of claim 1, wherein the defect concentration of said first thin film material is less than $1 \times 10^{16}$ cm$^{-3}$.

47. The method of claim 46, wherein the deposition rate of said first thin film material is greater than or equal to 100 Å/s.

48. The method of claim 47, wherein the deposition rate of said first thin film material is greater than or equal to 300 Å/s.

49. The method of claim 48, wherein the deposition rate of said first thin film material is greater than or equal to 400 Å/s.

50. The method of claim 1, further comprising forming a second thin film material over said first thin film material.

51. The method of claim 50, wherein said first thin film material is n-type and said second thin-film material is p-type.

52. The method of claim 50, wherein said first and second thin film materials comprise Si.

53. The method of claim 50, wherein said first thin film material comprises an amorphous phase and said second thin film material comprises a nanocrystalline phase.

54. The method of claim 50, wherein said second thin film material is formed from a second intermediate, said second intermediate including a second metastable species, said second intermediate being formed outside of said deposition chamber.

55. The method of claim 50, further comprising forming a third thin film material over said second thin film material.

56. The method of claim 55, wherein said first thin film material is n-type, said second thin film material is i-type, and said third thin film material is p-type.

* * * * *